United States Patent
Ito et al.

(10) Patent No.: US 12,501,552 B2
(45) Date of Patent: Dec. 16, 2025

(54) METHOD OF PROCESSING SUBSTRATE

(71) Applicant: Via Mechanics, Ltd., Atsugi (JP)

(72) Inventors: Yasushi Ito, Atsugi (JP); Takumi Osanai, Atsugi (JP)

(73) Assignee: VIA MECHANICS, LTD., Kanagawa (JP)

( * ) Notice: Subject to any disclaimer, the term of this patent is extended or adjusted under 35 U.S.C. 154(b) by 165 days.

(21) Appl. No.: 18/356,419

(22) Filed: Jul. 21, 2023

(65) Prior Publication Data
US 2024/0040704 A1    Feb. 1, 2024

(30) Foreign Application Priority Data

Jul. 29, 2022  (JP) ................. 2022-121998

(51) Int. Cl.
*H05K 3/00* (2006.01)
*H05K 3/46* (2006.01)

(52) U.S. Cl.
CPC ........... *H05K 3/007* (2013.01); *H05K 3/0029* (2013.01); *H05K 3/0052* (2013.01); *H05K 3/4688* (2013.01)

(58) Field of Classification Search
CPC .... H05K 3/007; H05K 3/0029; H05K 3/0052; H05K 3/4688; H05K 3/4605; H05K 3/0097; H05K 3/0044; H05K 3/0026; H01L 21/268; H01L 21/78; B23K 26/38; B23K 26/40

See application file for complete search history.

(56) References Cited

U.S. PATENT DOCUMENTS

| | | | |
|---|---|---|---|
| 5,779,833 A * | 7/1998 | Cawley | B29C 64/40 156/263 |
| 8,383,983 B2 * | 2/2013 | Lee | H05K 3/0029 219/121.72 |
| 9,548,246 B2 * | 1/2017 | Fujii | H01L 21/6836 |
| 2016/0204032 A1 * | 7/2016 | Kaempf | H10H 20/01 257/620 |
| 2018/0141235 A1 * | 5/2018 | Guenster | B33Y 70/00 |
| 2019/0030648 A1 * | 1/2019 | Priewasser | H01L 21/3065 |
| 2020/0134441 A1 * | 4/2020 | Suthar | G06F 11/3466 |
| 2020/0198179 A1 * | 6/2020 | Sugiyama | B32B 18/00 |

FOREIGN PATENT DOCUMENTS

JP    2008-112876 A    5/2008

* cited by examiner

*Primary Examiner* — Nahida Sultana
(74) *Attorney, Agent, or Firm* — McCormick, Paulding & Huber PLLC

(57) ABSTRACT

A purpose of the present invention is to provide a method of processing a substrate to improve a processing efficiency of the substrate. The method includes steps of: dividing a raw ceramic substrate into small substrates; annealing the divided small substrates; arraying the annealed small substrates; fixing the arrayed small substrates by using an organic member to form a large substrate; emitting laser beam to the arrayed small substrates in the large substrate to process a through hole; filling the through hole with a conductor; printing a wiring on the arrayed small substrates in the large substrate; stacking a new layer on front and back surfaces of the arrayed small substrates in the large substrate; and cutting the organic member of the large substrate to divide the large substrate into the small substrates.

1 Claim, 3 Drawing Sheets

FIG. 1A
FIG. 1B
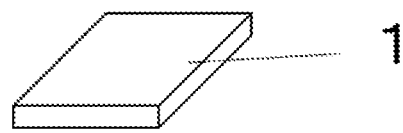
FIG. 1C
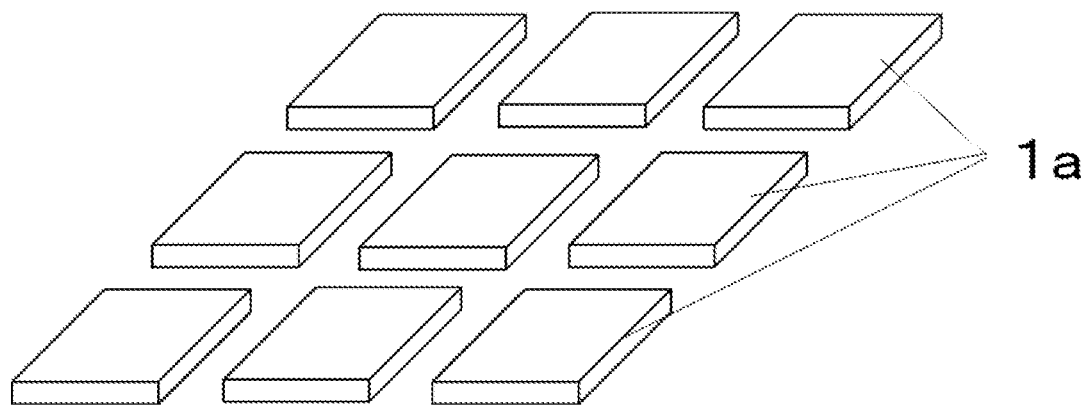
FIG. 1D
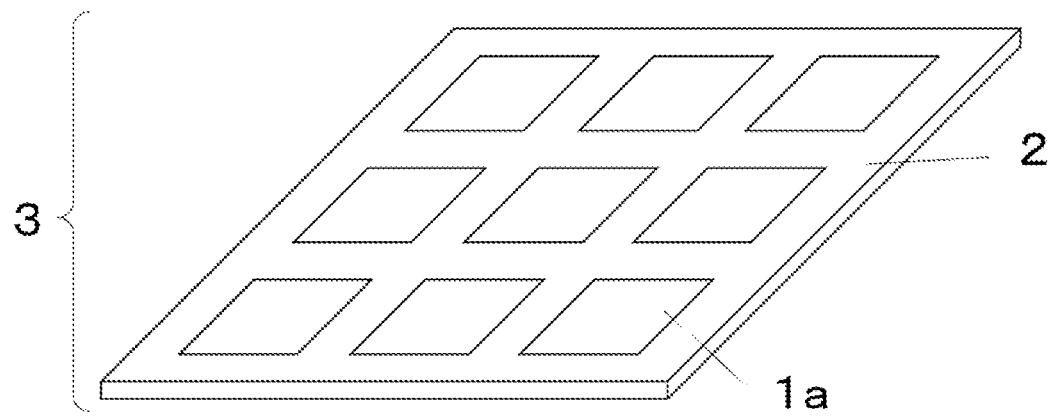

METHOD OF PROCESSING SUBSTRATE

CROSS-REFERENCE TO RELATED APPLICATION

This application claims foreign priority benefits under 35 U.S.C. § 119 from Japanese Patent Application No. 2022-121998, filed Jul. 29, 2022, the content of which is hereby incorporated by reference in its entirety.

TECHNICAL FIELD

The present invention relates to a method of processing a substrate containing, for example, ceramics used for a substrate of an electronic circuit board, as a composite material.

BACKGROUND

In recent years, as disclosed in, for example, Japanese Patent Application Laid-open Publication No. 2008-112876 (Patent Document 1), a method of processing a ceramic substrate is to perform laser processing to a raw ceramic substrate before annealing, and then, perform stacking and the annealing.

However, when the annealed substrate is divided into pieces each having a practical use size, cutting using a dicer or others significantly reduces a cutting speed and reduces lifetime of a blade of the dicer since a material of the substrate is hard. Also, in a case of cutting using laser beam, if an absorption rate of the laser beam is low, the cutting is inefficient and takes time. Therefore, in a stacked substrate containing the ceramics as a core member, a processing efficiency of the substrate is reduced.

Patent document 1: Japanese Patent Application Laid-open Publication No. 2008-112876

SUMMARY

Accordingly, the present invention has been made in consideration of the above-described circumstances, and its purpose is to provide a method of processing a substrate to improve a processing efficiency.

A typical method of processing a substrate of the invention disclosed in the present application includes: a step of dividing a raw ceramic substrate into small substrates; a step of annealing the divided small substrates; a step of arraying the annealed small substrates; a step of fixing the arrayed small substrates by using an organic member to form a large substrate; a step of emitting laser beam to the arrayed small substrates in the large substrate to process a through hole; a step of filling the through hole with a conductor; a step of printing a wiring on the arrayed small substrates in the large substrate; a step of stacking a new layer on front and back surfaces of the arrayed small substrates in the large substrate; and a step of cutting the organic member of the large substrate to divide the substrate into the small substrates.

Note that typical characteristics of the invention disclosed in the present application are as described above. However, characteristics not explained here will be explained in the section <BEST MODE FOR CARRYING OUT THE INVENTION>later, and also will be as described in <Claims>.

According to the present invention, a processing efficiency of a substrate can be improved.

BRIEF DESCRIPTIONS OF THE DRAWINGS

FIG. 1A is a process drawing for explaining a divided small substrate;

FIG. 1B is a process drawing for explaining a step of annealing the divided small substrate;

FIG. 1C is a process drawing for explaining arrayed small substrates;

FIG. 1D is a process drawing for explaining connected small substrates via an organic adhesive member;

DETAILED DESCRIPTION

Figure 1E:
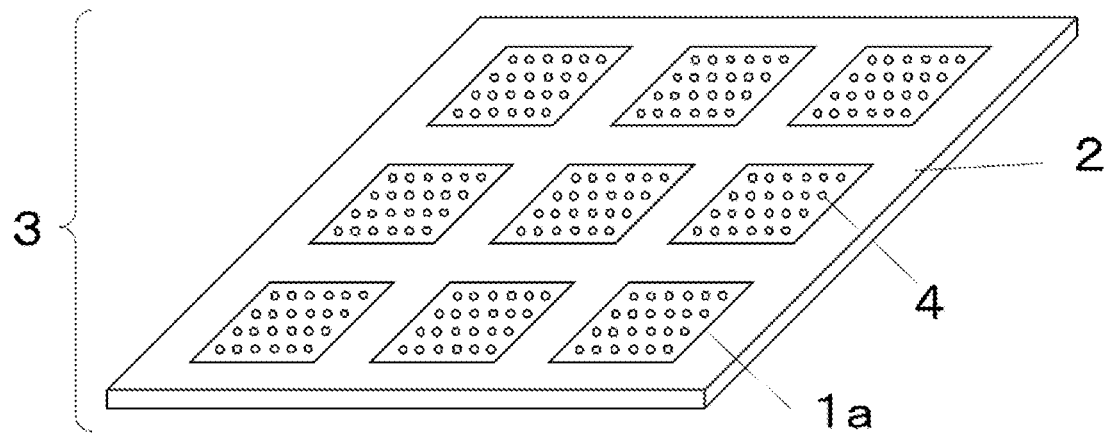
FIG. 1E is a process drawing for explaining a step of forming through holes on arrayed small substrates.

Hereinafter, embodiments of the present invention will be described through an example with reference to the accompanying drawings. Note that the same components are denoted by the same reference signs in the following explanation, and the explanation thereof will be omitted.

A laser processing method according to one embodiment of the present invention will be explained. First, in a first step, a large raw ceramic substrate to be punched is individuated into small substrates 1 having a final necessary size as shown in FIG. 1A. In the present step, the raw ceramic substrate is divided into the small substrates (substrates 1). The individuation is performed by die punching or others.

Next, in a second step, FIG. 1B shows an annealing step of annealing the raw ceramic substrate while putting the raw ceramic substrate into a furnace. In the present step, a plurality of substrates 1 that have been individuated in the first step are annealed. In the present step, the divided small substrates (substrates 1a in FIG. 1A) are annealed.

Next, in a third step, as shown in FIG. 1C, the annealed substrates 1a are arrayed. In the present step, the annealed small substrates (substrates 1a) are arrayed. In FIG. 1C, note that the number of the substrates 1a is nine so that the substrates are arrayed in a form of "3 row×3 column". However, array of a large number of substrates such as 36 substrates arrayed in a form of "6 row×6 column" can improve the processing efficiency in a laser punching step described later.

Next, in a fourth step, as shown in FIG. 1D, periphery of the plurality of arrayed substrates 1a is fixed by an organic member 2 such as resin to form a large substrate 3. In the present step, the arrayed small substrates (substrates 1a) are fixed by the organic member to form the large substrate.

Next, in a fifth step, as shown in FIG. 1E, laser is emitted to positions to be punched in the substrates 1a in the large substrate 3 to form through holes 4. In the present step, laser is emitted to the arrayed small substrates (substrates 1a) in the large substrate 3 to process the through holes 4.

Figure 2A:
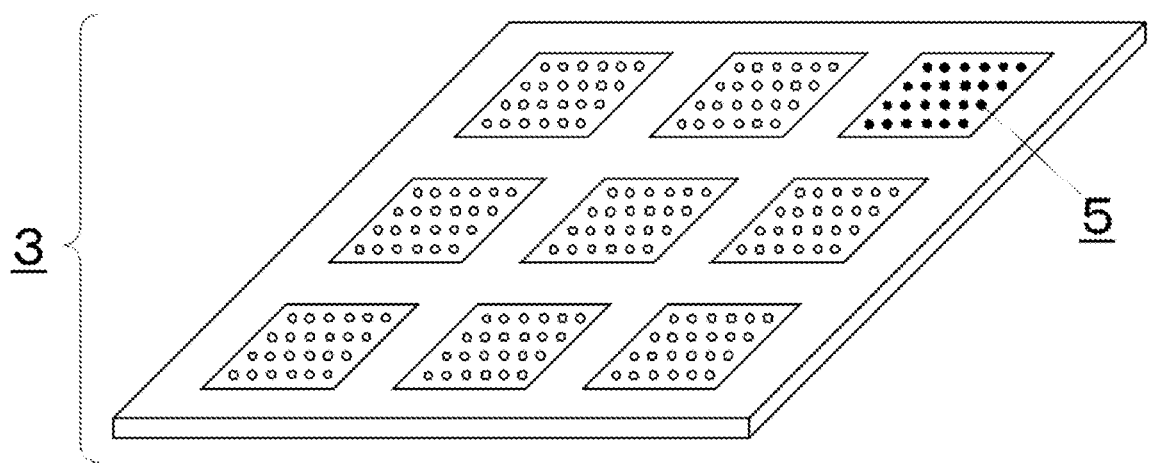
FIG. 2A is a process drawing for explaining a step of filling the through hole with a conductor.

Next, in a sixth step, as shown in FIG. 2A, each through hole 4 is filled with a conductor 5 in order to electrically connect upper and lower sides of the substrates 1a in the large substrate 3. In the present step, the through hole 4 is filled with the conductor 5.

Figure 2B:
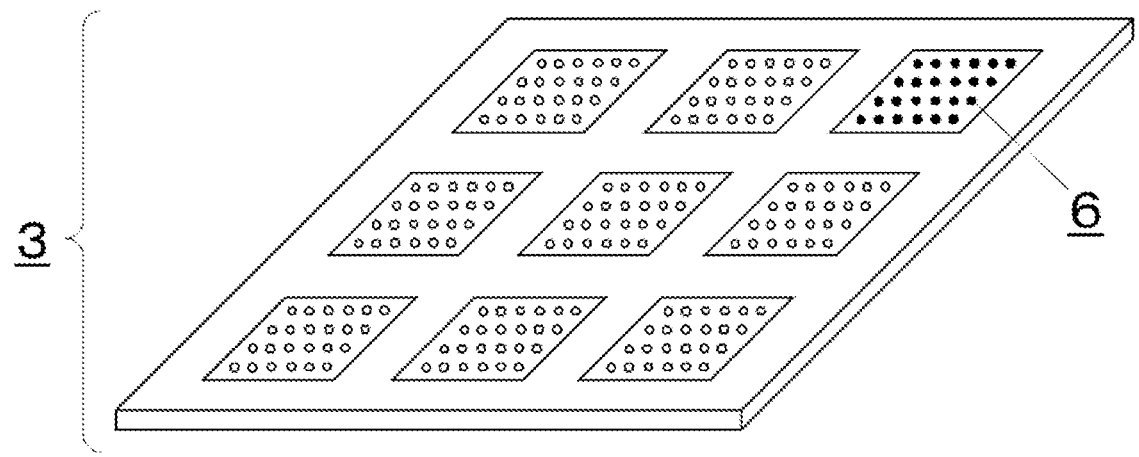
FIG. 2B is a process drawing for explaining a step of printing a wiring on the arrayed small substrates.

Next, in a seventh step, as shown in FIG. 2B, a wiring material 6 extending in a plan direction is formed on surfaces of the substrates 1a in the large substrate 3 by printing or others. In the present step, the wiring is printed on the arrayed small substrates (substrates 1*a*) in the large substrate 3.

Figure 2C:
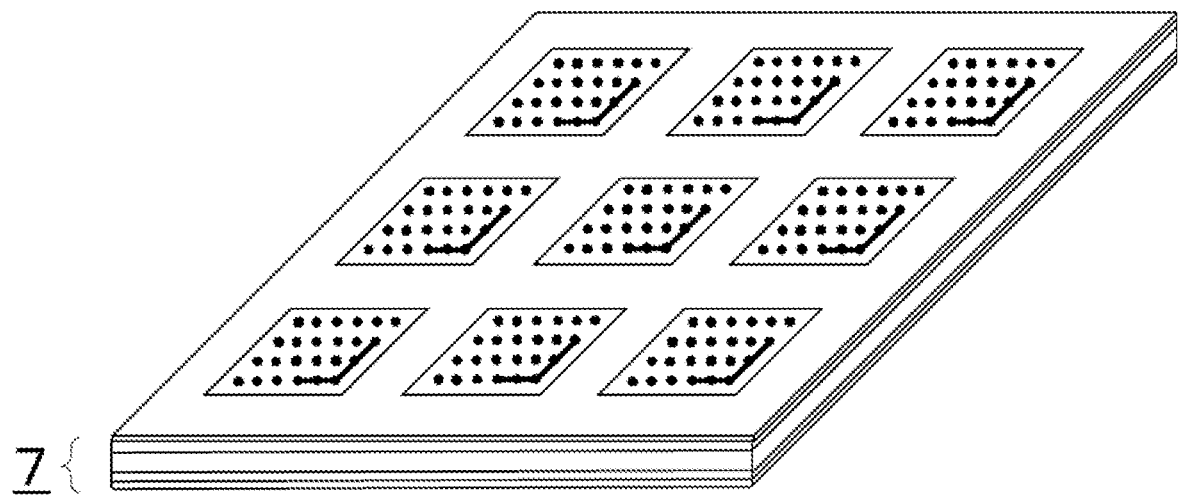
FIG. 2C is a process drawing for explaining a step of stacking a new large substrate on front and back surfaces of the arrayed small substrates.

Next, in an eighth step, as shown in FIG. 2C, building up is performed by repeating the resin layer formation, the wiring printing and others (the punching, the conductor filling, the printing of the wiring material) on front and back surfaces of the large substrate 3 (see FIG. 2B) formed as described above to manufacture a stacked body 7. In the present step, a new layer is stacked on front and back surfaces of the arrayed small substrates (substrates 1*a*) in the large substrate 3. Note that the wiring printing and others are performed on only the upper and lower sides of the substrates 1*a* in the large substrate 3, and only the resin layer is formed on upper and lower sides of the organic member 2 in the periphery of the substrates 1*a*.

Figure 2D:
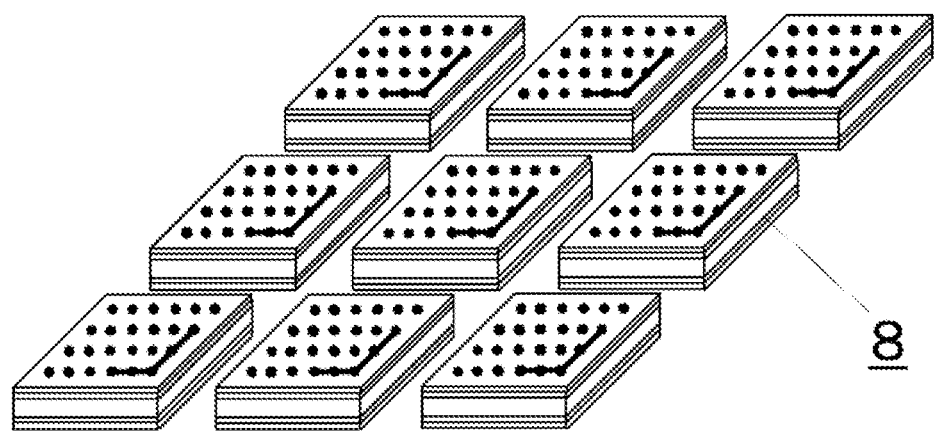
FIG. 2D is a process drawing for explaining a step of cutting the organic adhesive member of the large substrate.

Next, in a ninth step, as shown in FIG. 2D, the organic member 2 is cut in the stacked body 7 to divide the stacked body into individual stacked substrates 8. In the present step, the organic member 2 in the large substrate 3 is cut to divide the stacked body into small substrates (stacked substrates 8). The organic member 2 is cut by cutting process such as router processing.

According to the above-described example, the periphery of the small substrates of the annealed substrates is fixed by the resin, and its resin portion is cut and processed. Therefore, the reduction in the processing speed can be suppressed, and the processing efficiency can be improved. Also, the reduction of the lifetime of the cutting tool can be prevented.

In the foregoing, the present invention has been concretely described on the basis of the example. However, it is needless to say that the present invention is not limited to the foregoing example, and various modifications can be made within the scope of the present invention so that the present invention includes various modification examples.

What is claimed is:

1. A laser processing method comprising steps of:
   (a) dividing a raw ceramic substrate into small substrates;
   (b) annealing the divided small substrates;
   (c) arraying the annealed small substrates;
   (d) connecting the arrayed small substrates with each other via an organic adhesive member to form a large substrate;
   (e) emitting laser beam to the arrayed small substrates in the large substrate to process a through hole;
   (f) filling the through hole with a conductor;
   (g) printing a wiring on the arrayed small substrates in the large substrate;
   (h) stacking a new large substrate formed through the steps (a) to (g) on front and back surfaces of the arrayed small substrates in the large substrate; and
   (i) cutting the organic adhesive member of the large substrate to divide the large substrate into the small substrates.

* * * * *